United States Patent [19]
Kawasumi

[11] Patent Number: 6,141,258
[45] Date of Patent: Oct. 31, 2000

[54] PROGRAMMABLE IMPEDANCE OUTPUT BUFFER DRIVERS, SEMICONDUCTOR DEVICES AND STATIC RANDOM ACCESS MEMORIES PROVIDED WITH A PROGAMMABLE IMPEDANCE OUTPUT PORT

[75] Inventor: Atsushi Kawasumi, Yokohama, Japan

[73] Assignee: Kabushki Kaisha Toshiba, Kanagawa-ken, Japan

[21] Appl. No.: 09/456,775

[22] Filed: Dec. 8, 1999

[30] Foreign Application Priority Data

Dec. 11, 1998 [JP] Japan .................................. 10-353444

[51] Int. Cl.[7] .................................................... G11C 16/04
[52] U.S. Cl. ...................................... 365/189.05; 327/538
[58] Field of Search .......................... 365/189.05, 189.11, 365/189.12, 210; 327/538

[56] References Cited

U.S. PATENT DOCUMENTS 5,355,038  10/1994  Hui .......................................... 307/603
5,576,656  11/1996  McClure ................................. 327/538
5,596,297   1/1997  McClure et al. ....................... 327/538
5,917,335   6/1999  Rees ......................................... 326/27

Primary Examiner—Amir Zarabian
Assistant Examiner—Anh Phung
Attorney, Agent, or Firm—Banner & Witcoff, Ltd.

[57] ABSTRACT

The impedance of a pull-down output buffer circuit is adjusted to an integer multiple of the resistance value of an off-chip resistor with reference to the adjustment information obtained by adjusting the impedance of the pull-down dummy buffer circuits 13 and 14 to the resistance value of the off-chip resistor by means of a pull-down counter. The impedance of the pull-up output buffer circuit is adjusted to the pull-down dummy buffer circuit 14, i.e., an integer multiple of the resistance value of an off-chip resistor with reference to the adjustment information obtained by adjusting the impedance of the pull-up dummy buffer circuit to the impedance of the pull-down dummy buffer circuit 14 by means of a pull-up counter.

27 Claims, 8 Drawing Sheets

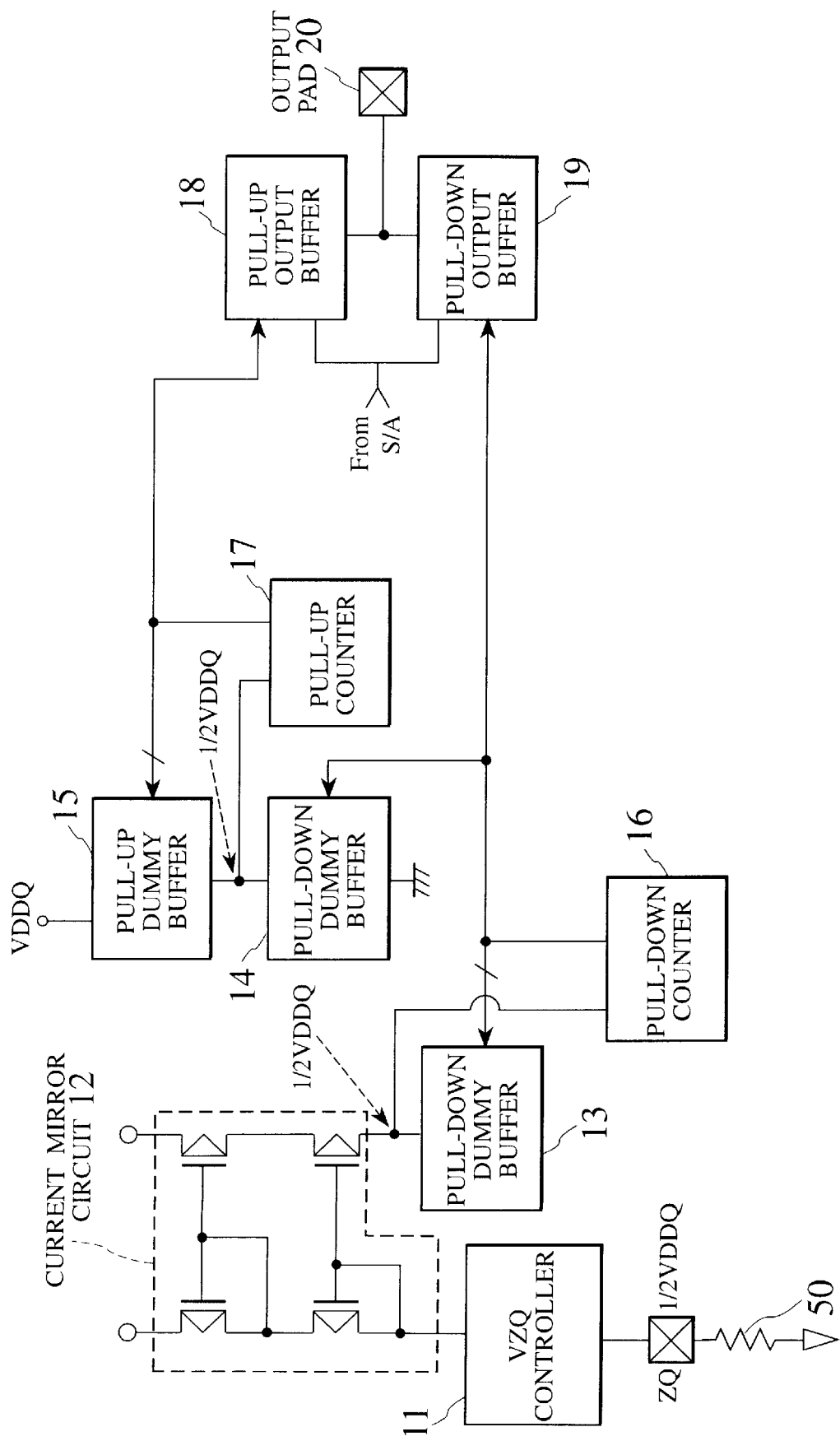

PROGRAMMABLE IMPEDANCE OUTPUT BUFFER DRIVERS, SEMICONDUCTOR DEVICES AND STATIC RANDOM ACCESS MEMORIES PROVIDED WITH A PROGAMMABLE IMPEDANCE OUTPUT PORT

CROSS REFERENCE TO RELATED APPLICATIONS

The subject application is related to subject matter disclosed in the Japanese Patent Application No.Hei10-353444 filed in Dec. 11, 1998 in Japan, to which the subject application claims priority under the Paris Convention and which is incorporated by reference herein.

BACKGROUND OF THE INVENTION

1. Field of the Invention

The present Invention is related to an improvement of The programmable impedance output buffer driver and the semiconductor device such as a static random access memory provided with a programmable impedance output buffer driver for adjusting the impedance of the output buffer circuit of the semiconductor device.

2. Description of the Related Art

In the recent years, along with increasing frequencies of input/output operations in the field of the semiconductor integrated circuits, it becomes increasingly important to avoid matching problems caused between the impedance of an output buffer circuit and the impedance of a transmission line formed on a printed circuit board (PCB).

In the prior art semiconductor devices, however, if there exists a mismatch between the impedance of the bus lines of the system and the impedance of the output buffer circuit of the device which is connected to the bus lines, undesirable reflection waves take place at the interface so that it is impossible to realize high speed data transmission and high speed operation of the system bus due to the reflection waves.

A new technique called the programmable impedance output buffer driver has been proposed wherein even if the environment is changed, the impedance of the output buffer circuit can be finely adjusted to a 1/n of the impedance as prepared between a ZQ pad and VSS by a user. This technique becomes one of the important circuit techniques for realizing the high speed data transmission.

FIG. 1 is a circuit diagram showing the outline of the programmable impedance output buffer driver in accordance with prior art techniques. One terminal of an off-chip resistor 50 is connected to a pad ZQ of the semiconductor integrated circuit which is provided with the programmable impedance output buffer driver by a user. The other terminal of the off-chip resistor 50 is connected to the ground terminal. The voltage applied to the pad ZQ is adjusted to a constant voltage, i.e., the half reference potential (VDDQ/2) of the higher output potential (VDDQ) to be output from the programmable impedance output buffer, or an arbitrary appropriate potential within the tolerable vicinity thereof by means of a VZQ controller 1. A current mirror circuit 2 serves to reflect the electric current passing through the off-chip resistor 50 in order that the amount of the current passing through a pull-up dummy buffer circuit 3 is equal to the off-chip resistor 50.

At this time, the pull-up counter 4 is used to adjust the impedance of the pull-up dummy buffer circuit 3 equal to the resistance value of the off-chip resistor 50 by controlling the on/off operation of a plurality of transistors constituting the pull-up dummy buffer circuit 3 in order to change the total channel width of the transistors so that the potential level of the connection point between the pull-up dummy buffer circuit 3 and the current mirror circuit 2 is equal to VDDQ/2.

FIG. 2 is a circuit diagram showing the outline of the pull-up dummy buffer circuit 3 as described above. The pull-up dummy buffer circuit 3 is comprised of a plurality of MOS transistors Tr connected in parallel. The impedance of the pull-up dummy buffer circuit 3 can be adjusted by controlling the on/off operation of a plurality of the transistors Tr constituting the pull-up dummy buffer circuit 3.

FIG. 3 is a circuit diagram showing the outline of the pull-up output buffer circuit 7 as described above. The pull-up output buffer circuit 7 is also comprised of a plurality of MOS transistors Tr connected in parallel. In this case, the channel width of the transistors Tr is designed to be larger than the channel width of the MOS transistors constituting the pull-up dummy buffer circuit by a factor of n, where n is no smaller than 1. Typically, the number n is an integer, for example, five.

Because of this, the impedance of the pull-up output buffer circuit 7 can be adjusted by controlling the on/off operation of a plurality of the MOS transistors constituting the pull-up output buffer circuit 7, in the same manner as the channel width of the pull-up dummy buffer circuit 3, in order to adjust the impedance of the pull-up output buffer circuit 7 to a constant value corresponding to the value of the off-chip resistor 50.

Accordingly, by selecting an appropriate resistance value of the off-chip resistor 50, the impedance of the pull-up output buffer circuit 7 can be adjusted to the impedance of the propagation line on the printed circuit board.

Thence even if there is a change in the environment of the semiconductor integrated circuit provided with the programmable impedance output buffer driver as described above, for example, the power voltage, The temperature and so forth, it is possible to always maintain the constant value of the impedance of the pull-up output buffer circuit 7, to maintain the impedance matching between the impedance of the pull-up output buffer circuit 7 and the impedance of the propagation line resulting in the possibility of the high speed operation of the semiconductor integrated circuit as described above.

The pull-down output buffer circuit 8 is adjusted in the same manner. Namely, the pull-down counter 6 is used to adjust the impedance of the pull-down dummy buffer circuit 5 in order to be equal to the resistance value of the off-chip resistor 50. The adjustment information of the pull-down counter 6 is also used to adjust the impedance of the pull-down output buffer circuit 8 in order to be equal to a 1/n of the resistance value of the off-chip resistor 50. Typically, the number n is an integer, for example, five as described above.

On the other hand, the mirror ratio of the current mirror circuit 2 for the prior art programmable impedance output buffer driver, i.e., the ratio of the electric current as output relative to the electric current as input from the current mirror circuit is preferably 1 or nearly 1 for the purpose of improving the accuracy of adjustment of the pull-up dummy buffer circuit 3 or the pull-down dummy buffer circuit 5. Accordingly, the current mirror circuit 2 is composed of the transistors connected to each other in series in order to make the mirror ratio of the current mirror circuit 2 as nearer to 1 as possible.

However, along with the decrease in the output voltage from the output pad 9 as recently required, since there results a substantial decrease in the differential voltage between the source and the drain, it is difficult to enable a stable operation of the transistors of the current mirror circuit 2 in the pentode region during an impedance matching operation conducted by controlling the on/off operation of the MOS transistors Tr constituting the pull-up dummy buffer circuit 3 or the pull-down dummy buffer circuit 5.

Particularly, since there is a substantial voltage drop between the source and the drain of the transistors connected in series of the current mirror circuit 2, which serves to flow the mirror current through the pull-up dummy buffer circuit 3, the mirror ratio of the mirror current largely deviate away from the desired value of 1 as described above so that the electric current passing through the pull-up dummy buffer circuit 3 is no longer in agreement with the electric current passing through the off-chip resistor 50.

Because of this, unlike the impedance of the pull-down dummy buffer circuit 5, the impedance of the pull-up dummy buffer circuit 3 can no longer be adjusted to the resistance value of the off-chip resistor 50. The impedance of the pull-up output buffer circuit 7 is thereby not adjusted to the value corresponding to the resistance value of the resistor 50.

By this configuration, reflection waves occurs between the output pad 9 and the propagation line not shown in the figure and therefore adversely affect the high speed operation of the semiconductor integrated circuit even implemented with the programmable impedance output buffer driver.

SUMMARY OF THE INVENTION

The present invention has been made in order to solve the shortcomings as described above. It is an object of the present invention to provide an improved programmable impedance output buffer driver which makes it possible to adjust the impedance of the output buffer circuit of the semiconductor device to the impedance corresponding to the resistance value of the off-chip resistor with high accuracy by securing a sufficient marginal area of the pentode region of the current mirror circuit.

It is another object of the present invention to provide a semiconductor device equipped with an improved programmable impedance output buffer driver which makes it possible to adjust the impedance of the output buffer circuit of the semiconductor device to the impedance corresponding to the resistance value of the off-chip resistor with high accuracy by securing a sufficient marginal area of the pentode region of the current mirror circuit.

It is a further object of the present invention to provide a static random access memory having a programmable impedance output port which makes it possible to adjust the impedance of the output buffer circuit of the semiconductor device to the impedance corresponding to the resistance value of the off-chip resistor with high accuracy by securing a sufficient marginal area of the pentode region of the current mirror circuit.

In brief, the above and other objects and advantages of the present invention are provided by a new and improved semiconductor device having a programmable impedance output port comprising; a pad to which an external resistor is to be connected; a voltage controlling circuit for controlling the potential level of said pad; a current mirror circuit connected in series with said pad and said voltage controlling circuit in order to generate a mirror current of the electric current applied to said pad; a first pull-down dummy buffer circuit having a variable impedance and connected to said current mirror circuit in series in order that said mirror current flows said first pull-down dummy buffer circuit; a second pull-down dummy buffer circuit having a variable impedance; pull-up dummy buffer circuit having a variable impedance and connected to said second pull-down dummy buffer circuit in series; a pull-down output buffer circuit having a variable impedance connected to said programmable impedance output port; a pull-up output buffer circuit having a variable impedance connected to said programmable impedance output port; a first control circuit for controlling the impedance of said first pull-down dummy buffer circuit in agreement with the resistance value of said external resistor in order to generate first adjustment information, for controlling the impedance of said second pull-down dummy buffer circuit in agreement with the resistance value of said external resistor with reference to said first adjustment information, and for controlling the impedance of said pull-down output buffer circuit to an appropriate value which is proportional to the resistance value of said external resistor with reference to said first adjustment information; and a second control circuit for controlling the impedance of said pull-up dummy buffer circuit in agreement with the impedance of said second pull-down dummy buffer circuit in order to generate second adjustment information, and for controlling the impedance of said pull-up output buffer circuit to an appropriate value which is proportional to the resistance value of said external resistor with reference to said second adjustment information.

In accordance with another aspect of the present invention, a semiconductor device having a programmable impedance output port comprises a pad to which an external resistor is to be connected; a voltage controlling circuit for controlling the potential level of said pad; a current mirror circuit connected in series with said pad and said voltage controlling circuit in order to generate a mirror current of the electric current passing through said external resistor from said pad: a first pull-down dummy buffer circuit having a variable impedance and connected to said current mirror circuit in series in order that said mirror current flows said first pull-down dummy buffer circuit; second pull-down dummy buffer circuit having a fixed impedance; a pull-up dummy buffer circuit having a variable impedance and connected to said second pull-down dummy buffer circuit in series; a pull-down output buffer circuit having a variable impedance connected to said programmable impedance output port; a pull-up output buffer circuit having a variable impedance connected to said programmable impedance output port; a first control circuit for controlling the impedance of said first pull-down dummy buffer circuit in agreement with the resistance value of said external resistor in order to generate first adjustment information, and for controlling the impedance of said pull-down output buffer circuit to an appropriate value which is proportional to the resistance value of said external resistor with reference to said first adjustment information; a second control circuit for controlling the impedance of said pull-up dummy buffer circuit in agreement with the impedance of said second pull-down dummy buffer circuit in order to generate second adjustment information; and a calculation circuit for performing an appropriate operation using the first adjustment information obtained from the first control circuit and the second adjustment information obtained from the second control circuit, wherein the impedance of said pull-up output buffer circuit is adjusted to an appropriate value which is proportional to the resistance value of said external resistor with reference to the result of said appropriate operation.

In accordance with a further aspect of the present invention, a semiconductor device having a programmable impedance output port comprises: a pad to which an external resistor is to be connected; a voltage controlling circuit for controlling the potential level of said pad; a current mirror circuit connected in series with said pad and said voltage controlling circuit in order to generate a mirror current of the electric current passing through said external resistor from said pad; a first pull-down dummy buffer circuit having a variable impedance and connected to said current mirror circuit in series in order that said mirror current flows said first pull-down dummy buffer circuit; a second pull-down dummy buffer circuit having a variable impedance; a pull-up dummy buffer circuit having a fixed impedance and connected to said second pull-down dummy buffer circuit in series; a pull-down output buffer circuit having a variable impedance connected to said programmable impedance output port: a pull-up output buffer circuit having a variable impedance connected to said programmable impedance output port; a first control circuit for controlling the impedance of said first pull-down dummy buffer circuit in agreement with the resistance value of said external resistor in order to generate first adjustment information, and for controlling the impedance of said pull-down output buffer circuit to an appropriate value which is proportional to the resistance value of said external resistor with reference to said first adjustment information; a second control circuit for controlling the impedance of said second pull-down dummy buffer circuit in agreement with the impedance of said pull-up dummy buffer circuit in order to generate second adjustment information; and a calculation circuit for performing an appropriate operation using the first adjustment information obtained from the first control circuit and the second adjustment information obtained from the second control circuit, wherein the impedance of said pull-up output buffer circuit is adjusted to an appropriate value which is proportional to the resistance value of said external resistor with reference to the result of said appropriate operation.

In accordance with a further aspect of the present invention, a programmable impedance output buffer driver comprises: a pad to which an external resistor is to be connected; a voltage controlling circuit for controlling the potential level of said pad; a current mirror circuit connected in series with said pad and said voltage controlling circuit in order to generate a mirror current of the electric current passing through said external resistor from said pad; first pull-down dummy buffer circuit having a variable impedance and connected to said current mirror circuit in series in order that said mirror current flows said first pull-down dummy buffer circuit; a second pull-down dummy buffer circuit having a variable impedance; a pull-up dummy buffer circuit having a variable impedance and connected to said second pull-down dummy buffer circuit in series; a pull-down output buffer circuit having a variable impedance connected to said programmable impedance output port; a pull-up output buffer circuit having a variable impedance connected to said programmable impedance output port; a first control circuit for controlling the impedance of said first pull-down dummy buffer circuit in agreement with the resistance value of said external resistor in order to generate first adjustment information, for controlling the impedance of said second pull-down dummy buffer circuit in agreement with the resistance value of said external resistor with reference to said first adjustment information, and for controlling the impedance of said pull-down output buffer circuit to an appropriate value which is proportional to the resistance value of said external resistor with reference to said first adjustment information; and a second control circuit for controlling the impedance of said pull-up dummy buffer circuit in agreement with the impedance of said second pull-down dummy buffer circuit in order to generate second adjustment information, and for controlling the impedance of said pull-up output buffer circuit to an appropriate value which is proportional to the resistance value of said external resistor with reference to said second adjustment information.

In accordance with a further aspect of the present invention, a programmable impedance output buffer driver comprises: a pad to which an external resistor is to be connected; a voltage controlling circuit for controlling the potential level of said pad; a current mirror circuit connected in series with said pad and said voltage controlling circuit in order to generate a mirror current of the electric current passing through said external resistor from said pad; a first pull-down dummy buffer circuit having a variable impedance and connected to said current mirror circuit in series in order that said mirror current flows said first pull-down dummy buffer circuit; second pull-down dummy buffer circuit having a fixed impedance; a pull-up dummy buffer circuit having a variable impedance and connected to said second pull-down dummy buffer circuit in series; a pull-down output buffer circuit having a variable impedance connected to said programmable impedance output port; a pull-up output buffer circuit having a variable impedance connected to said programmable impedance output port; a first control circuit for controlling the impedance of said first pull-down dummy buffer circuit in agreement with the resistance value of said external resistor in order to generate first adjustment information, and for controlling the impedance of said pull-down output buffer circuit to an appropriate value which is proportional to the resistance value of said external resistor with reference to said first adjustment information; a second control circuit for controlling the impedance of said pull-up dummy buffer circuit in agreement with the impedance of said second pull-down dummy buffer circuit in order to generate second adjustment information; and a calculation circuit for performing an appropriate operation using the first adjustment information obtained from the first control circuit and the second adjustment information obtained from the second control circuit, wherein the impedance of said pull-up output buffer circuit is adjusted to an appropriate value which is proportional to the resistance value of said external resistor with reference to the result of said appropriate operation.

In accordance with a further aspect of the present invention, a programmable impedance output buffer driver comprises: a pad to which an external resistor is to be connected; a voltage controlling circuit for controlling the potential level of said pad; a current mirror circuit connected in series with said pad and said voltage controlling circuit in order to generate a mirror current of the electric current passing through said external resistor from said pad; a first pull-down dummy buffer circuit having a variable impedance and connected to said current mirror circuit in series in order that said mirror current flows said first pull-down dummy buffer circuit; a second pull-down dummy buffer circuit having a variable impedance; a pull-up dummy buffer circuit having a fixed impedance and connected to said second pull-down dummy buffer circuit in series; a pull-down output buffer circuit having a variable impedance connected to said programmable impedance output port; a pull-up output buffer circuit having a variable impedance connected to said programmable impedance output port; a first control circuit for controlling the impedance of said first pull-down dummy buffer circuit in agreement with the resistance value of said external resistor in order to generate first adjustment information, and for controlling the impedance of said pull-down output buffer circuit to an appropriate value which is proportional to the resistance value of said external resistor with reference to said first adjustment information; a second control circuit for controlling the impedance of said second pull-down dummy buffer circuit in agreement with the impedance of said pull-up dummy buffer circuit in order to generate second adjustment information; and a calculation circuit for performing an appropriate operation using the first adjustment information obtained from the first control circuit and the second adjustment information obtained from the second control circuit, wherein the impedance of said pull-up output buffer circuit is adjusted to an appropriate value which is proportional to the resistance value of said external resistor with reference to the result of said appropriate operation.

In accordance with a further aspect of the present invention, a static random access memory having a programmable impedance output port comprises: a memory cell array for storing data; a row address buffer; a row address decoder for decoding the row address; a column address buffer; a column address decoder for decoding the row address; a sense amplifier for outputting data stored In a memory cell of said memory cell array as designated by said row address and said column address; and a programmable impedance output buffer driver for outputting data signal as amplified by said sense amplifier, said programmable impedance output buffer driver comprising: pad to which an external resistor is to be connected; voltage controlling circuit for controlling the potential level of said pad; current mirror circuit connected in series with said pad and said voltage controlling circuit in order to generate a mirror current of the electric current passing through said external resistor from said pad; a first pull-down dummy buffer circuit having a variable impedance and connected to said current mirror circuit in series in order that said mirror current flows said first pull-down dummy buffer circuit; a second pull-down dummy buffer circuit having a variable impedance; a pull-up dummy buffer circuit having a variable impedance and connected to said second pull-down dummy buffer circuit in series; a pull-down output buffer circuit having a variable impedance connected to said programmable impedance output port; a pull-up output buffer circuit having a variable impedance connected to said programmable impedance output port; a first control circuit for controlling the impedance of said first pull-down dummy buffer circuit in agreement with the resistance value of said external resistor in order to generate first adjustment information, for controlling the impedance of said second pull-down dummy buffer circuit in agreement with the resistance value of said external resistor with reference to said first adjustment information, and for controlling the impedance of said pull-down output buffer circuit to an appropriate value which is proportional to the resistance value of said external resistor with reference to said first adjustment information; and a second control circuit for controlling the impedance of said pull-up dummy buffer circuit in agreement with the impedance of said second pull-down dummy buffer circuit in order to generate second adjustment information, and for controlling the impedance of said pull-up output buffer circuit to an appropriate value which is proportional to the resistance value of said external resistor with reference to said second adjustment information.

In accordance with a further aspect of the present invention, a static random access memory having a programmable impedance output port comprises: a memory cell array for storing data; a row address buffer; a row address decoder for decoding the row address; a column address buffer; a column address decoder for decoding the row address; a sense amplifier for outputting data stored in a memory cell of said memory cell array as designated by said row address and said column address; and a programmable impedance output buffer driver for outputting data signal as amplified by said sense amplifier, said programmable impedance output buffer driver comprising: a pad to which an external resistor is to be connected; a voltage controlling circuit for controlling the potential level of said pad; a current mirror circuit connected in series with said pad and said voltage controlling circuit in order to generate a mirror current of the electric current passing through said external resistor from said pad; a first pull-down dummy buffer circuit having a variable impedance and connected to said current mirror circuit in series in order that said mirror current flows said first pull-down dummy buffer circuit: second pull-down dummy buffer circuit having a fixed impedance; a pull-up dummy buffer circuit having a variable impedance and connected to said second pull-down dummy buffer circuit in series; a pull-down output buffer circuit having a variable impedance connected to said programmable impedance output port; a pull-up output buffer circuit having a variable impedance connected to said programmable impedance output port; a first control circuit for controlling the impedance of said first pull-down dummy buffer circuit in agreement with the resistance value of said external resistor in order to generate first adjustment information, and for controlling the impedance of said pull-down output buffer circuit to an appropriate value which is proportional to the resistance value of said external resistor with reference to said first adjustment information; a second control circuit for controlling the impedance of said pull-up dummy buffer circuit in agreement with the impedance of said second pull-down dummy buffer circuit in order to generate second adjustment information; and a calculation circuit for performing an appropriate operation using the first adjustment information obtained from the first control circuit and the second adjustment information obtained from the second control circuit, wherein the impedance of said pull-up output buffer circuit is adjusted to an appropriate value which is proportional to the resistance value of said external resistor with reference to the result of said appropriate operation.

In accordance with a further aspect of the present invention, a static random access memory having a programmable impedance output port comprises: a memory cell array for storing data; a row address buffer; a row address decoder for decoding the row address; a column address buffer; a column address decoder for decoding the row address; a sense amplifier for outputting data stored in a memory cell of said memory cell array as designated by said row address and said column address; and a programmable impedance output buffer driver for outputting data signal as amplified by said sense amplifier, said programmable impedance output buffer driver comprising: a pad to which an external resistor is to be connected; a voltage controlling circuit for controlling the potential level of said pad; a current mirror circuit connected in series with said pad and said voltage controlling circuit in order to generate a mirror current of the electric current passing through said external resistor from said pad; a first pull-down dummy buffer circuit having a variable impedance and connected to said current mirror circuit in series in order that said mirror current flows said first pull-down dummy buffer circuit; a second pull-down dummy buffer circuit having a variable impedance; a pull-up dummy buffer circuit having a fixed impedance and connected to said second pull-down dummy buffer circuit in series; a pull-down output buffer circuit having a variable impedance connected to said programmable impedance output port; a pull-up output buffer circuit having a variable impedance connected to said programmable impedance output port; a first control circuit for controlling the impedance of said first pull-down dummy buffer circuit in agreement with the resistance value of said external resistor in order to generate first adjustment information, and for controlling the impedance of said pull-down output buffer circuit to an appropriate value which is proportional to the resistance value of said external resistor with reference to said first adjustment information; a second control circuit for controlling the impedance of said second pull-down dummy buffer circuit in agreement with the impedance of said pull-up dummy buffer circuit in order to generate second adjustment information; and a calculation circuit for performing an appropriate operation using the first adjustment information obtained from the first control circuit and the second adjustment information obtained from the second control circuit, wherein the impedance of said pull-up output buffer circuit is adjusted to an appropriate value which is proportional to the resistance value of said external resistor with reference to the result of said appropriate operation.

Furthermore, in accordance with a preferred embodiment of the present invention, the impedance of said pull-down output buffer circuit is adjusted to 1/n of the resistance value of said external resistor with reference to said first adjustment information, where n is no smaller than 1.

Furthermore, in accordance with a preferred embodiment of the present invention, the number n is an integer.

Furthermore, in accordance with a preferred embodiment of the present invention, said first pull-down dummy buffer circuit, said second pull-down dummy buffer circuit, said pull-up dummy buffer circuit, said pull-down output buffer circuit and said pull-up output buffer circuit are composed of the same number of the transistors as connected in parallel.

Furthermore, in accordance with a preferred embodiment of the present invention, said first pull-down dummy buffer circuit, said second pull-down dummy buffer circuit, said pull-up dummy buffer circuit, said pull-down output buffer circuit and said pull-up output buffer circuit are composed respectively of a plurality of transistors connected in parallel, and wherein the adjustment information of said first control circuit is indicative of the channel width of said first pull-down dummy buffer circuit while the adjustment information of said second control circuit is indicative of the ratio of the effective channel width of said pull-up dummy buffer circuit to the effective channel width of said second pull-down dummy buffer circuit.

Furthermore, in accordance with a preferred embodiment of the present invention, said first pull-down dummy buffer circuit and said second pull-down dummy buffer circuit are designed in the same configuration in terms of the channel length and the channel width of the transistors thereof.

Furthermore, in accordance with a preferred embodiment of the present invention, said second control circuit serves to perform an appropriate operation of the channel width of said first pull-down dummy buffer circuit and the ratio of the channel width of said second pull-down dummy buffer circuit to the channel width of said pull-up dummy buffer circuit to generate the adjustment information of the pull-up output buffer circuit.

Furthermore, in accordance with a preferred embodiment of the present invention, said first control circuit serves to adjust the potential at the connection point between said current mirror circuit and said first pull-down dummy buffer circuit to a constant potential corresponding to a half of the output voltage of The programmable impedance output port, and wherein said second control circuit serves to adjust the potential at the connection point between said second pull-down dummy buffer circuit and said pull-up dummy buffer circuit to a constant potential corresponding to a half of the output voltage of the programmable impedance output port.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 4 is a block diagram showing a programmable impedance output buffer driver in accordance with a first embodiment of the present invention.

DETAILED DESCRIPTION OF EMBODIMENTS

Figure 1:
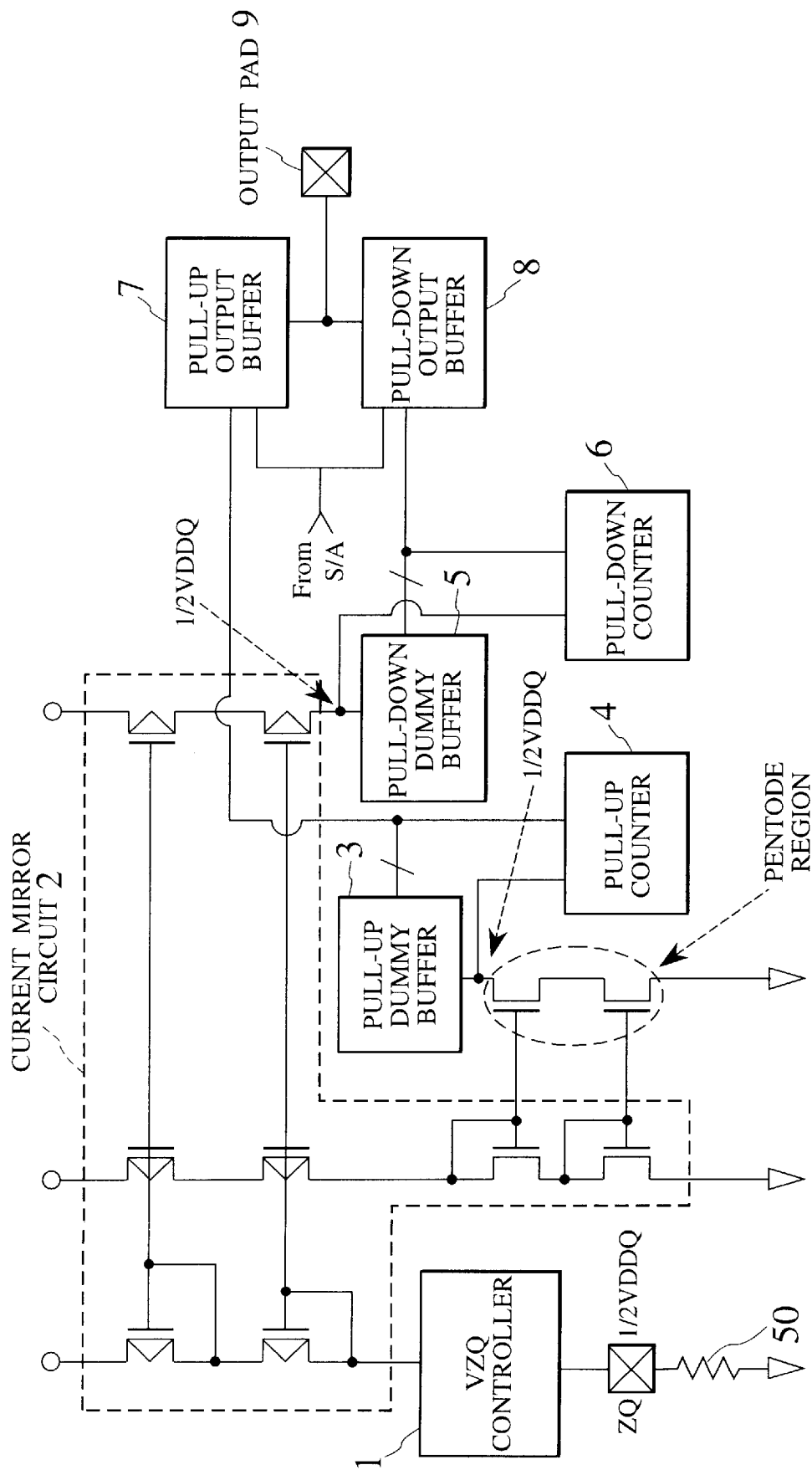
FIG. 1 is a circuit diagram showing the outline of the programmable impedance output buffer driver in accordance with prior art techniques.
Figure 2:
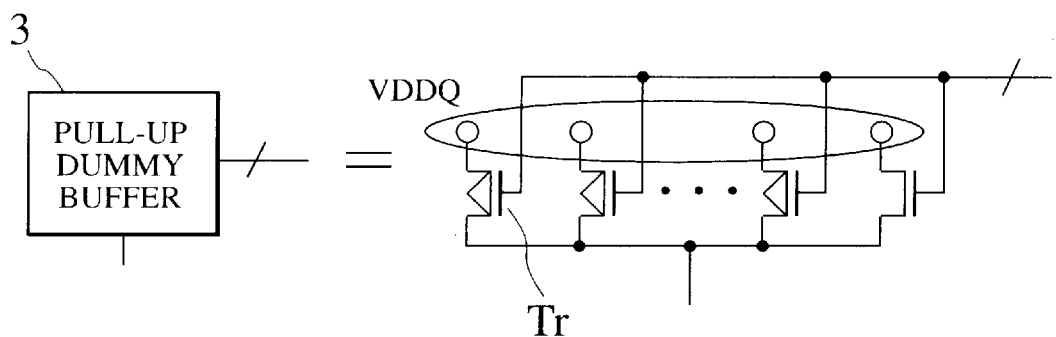
FIG. 2 is a circuit diagram showing the pull-up dummy buffer circuit of the programmable impedance output buffer driver In accordance with prior art techniques.
Figure 3:
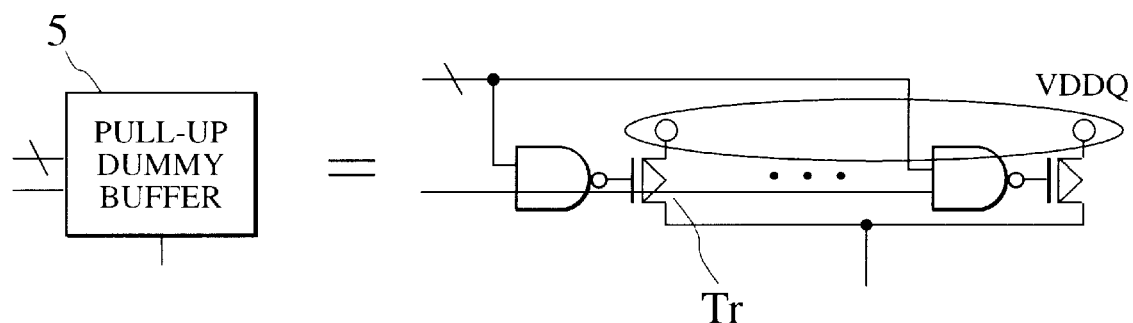
FIG. 3 is a circuit diagram showing the pull-up output buffer circuit as described above.

Hereinbelow, several preferred embodiments in accordance with the present invention will be explained in conjunction with the accompanied drawings. FIG. 4 is a block diagram showing a programmable impedance output buffer driver in accordance with a first embodiment of the present invention. The programmable impedance output buffer driver includes a VZQ controller 11, a current mirror circuit 12, a first pull-down dummy buffer circuit 13, a second pull-down dummy buffer circuit 14, a pull-up dummy buffer circuit 15, a pull-down counter 16, a pull-up counter 17, a pull-up output buffer circuit 18, a pull-down output buffer circuit 19, a pad 20 and the pad ZQ. An off-chip resistor 50 selected by a user is connected between the pad ZQ and the ground. The VZQ controller 11 serves to control the potential level of the pad ZQ to be VDDQ/2, which is a half of the output voltage VDDQ. The current mirror circuit 12 is connected to the VZQ controller 11 and the off-chip resistor 50 in series between the power voltage VDD and the ground and serves to reflect the electric current passing through the off-chip resistor 50 to the first pull-down dummy buffer circuit 13. The power voltage VDD is higher than the output voltage VDDQ.

The impedance of the first pull-down dummy buffer circuit 13 is adjusted to the impedance equal to the resistance value of the off-chip resistor 50. The impedance of the second pull-down dummy buffer circuit 14 is adjusted to the impedance equal to the resistance value of the off-chip resistor 50 on the basis of the adjustment information of the adjustment of the impedance the first pull-down dummy buffer circuit 13. The impedance of the pull-up dummy buffer circuit 15 is connected to the second pull-down dummy buffer circuit 14 between the output voltage VDDQ and the ground level, and adjusted to the impedance equal to the impedance of the second pull-down dummy buffer circuit 14. The pull-down counter 16 is used for adjusting the impedance of the first pull-down dummy buffer circuit 13 and 14 and the pull-down output buffer circuit 19 to be corresponding to the off-chip resistor 50. The pull-up counter 17 is used for adjusting the impedance of the pull-up dummy buffer circuit 15 to the impedance of the second pull-down dummy buffer circuit 14 and adjusting the impedance of the pull-up output buffer circuit 18 to the value corresponding to the resistance value of the off-chip resistor 50, The impedance of the pull-up output buffer circuit 18 is adjusted to the constant value corresponding to the resistance value of the off-chip resistor 50. The impedance of the pull-down output buffer circuit 19 is adjusted to the constant value corresponding to the resistance value of the off-chip resistor 50. The pad ZQ is connected to the off-chip resistor 50. The output pad 20 is connected to a propagation line not shown in the figure.

Figure 5A:
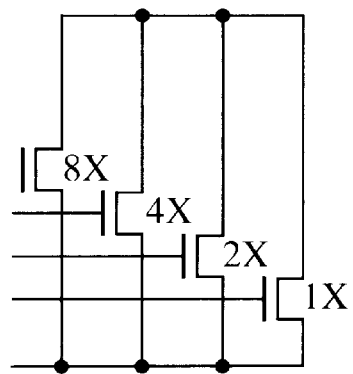
FIG. 5(A) is a schematic circuit diagram showing an exemplary dummy buffer circuit as used in the programmable impedance output buffer driver in accordance with the present invention.
Figure 5B:
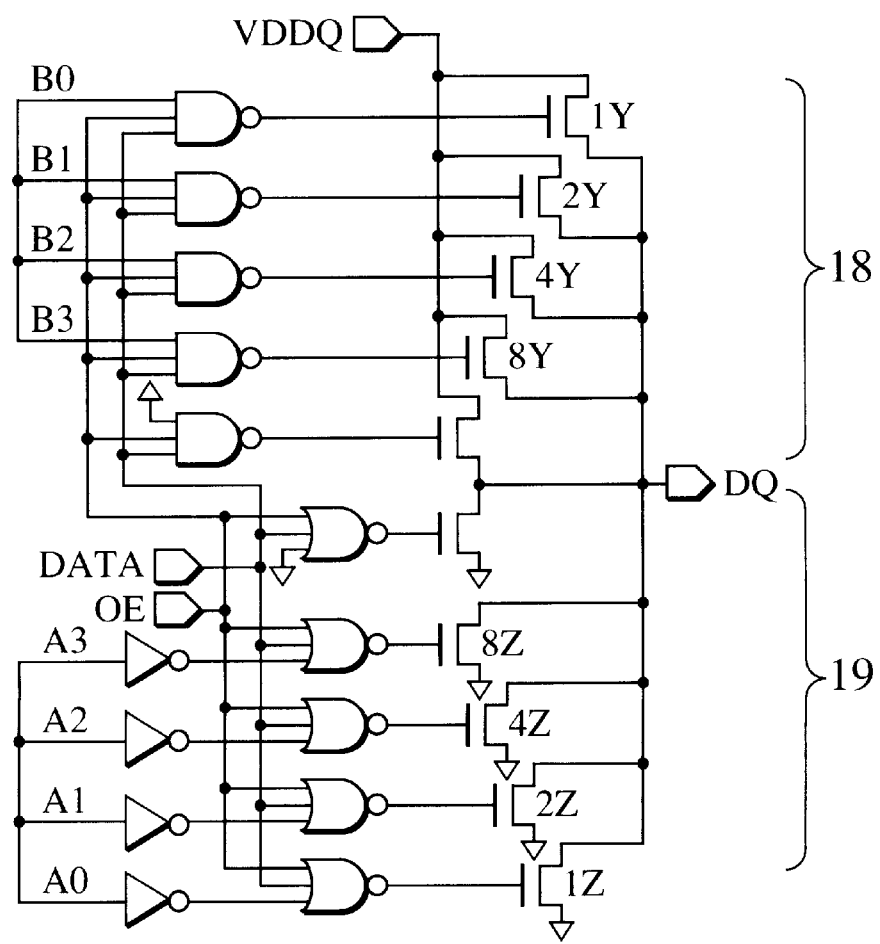
FIG. 5(B) is a schematic circuit diagram showing an exemplary pull-up output buffer and an exemplary pull-down output buffer as used in the programmable impedance output buffer driver in accordance with the present invention.

FIG. 5(A) is a schematic circuit diagram showing an exemplary dummy buffer circuit as used in the programmable impedance output buffer driver in accordance with the present invention. The pull-up dummy buffer circuit 15, the second pull-down dummy buffer circuit 14 and the first pull-down dummy buffer circuit 13 is generally designed as illustrated in FIG. 5(A). FIG. 5(B) is a schematic circuit diagram showing the configurations of the pull-up output buffer circuit 18 and the pull-down output buffer circuit 19. Signals A0 to A3 are given to the respective buffer circuits as adjustment information for the pull-down output buffer circuit 19 while Signals B0 to B3 are given to the respective buffer circuits as adjustment information for the pull-up output buffer circuit 18. The pull-up dummy buffer circuit 15, the second pull-down dummy buffer circuit 14, the first pull-down dummy buffer circuit 13, the pull-up output buffer circuit 18 and the pull-down output buffer circuit 19 includes the same number of the transistors as connected in parallel.

Next, the operation of this embodiment of the present invention will be explained. One terminal of an off-chip resistor 50 is connected to a pad ZQ of the semiconductor integrated circuit which is provided with the programmable impedance output buffer driver by a user. The other terminal of the off-chip resistor 50 is connected to the ground terminal. The voltage applied to the pad ZQ is adjusted to a constant voltage VDDQ/2, which is the output voltage of the semiconductor integrated circuit which is provided with the programmable impedance output buffer driver, by means of the VZQ controller 11. A current mirror circuit 12 serves to reflect the electric current passing through the off-chip resistor 50 in order that the amount of the current passing through the pull-up dummy buffer circuit 13 is equal to the amount of the current passing through the off-chip resistor 50.

At this time, the pull-up counter 16 is used to adjust the impedance of the pull-up dummy buffer circuit 13 equal to the resistance value of the off-chip resistor 50 by controlling the on/off operation of a plurality of transistors constituting the pull-up dummy buffer circuit 13 in order to change the total effective channel width of the transistors so that the potential level of the connection point between the pull-up dummy buffer circuit 3 and the current mirror circuit 12 is equal to VDDQ/2.

Furthermore, the pull-up counter 16 is used to adjust the impedance of the second pull-down dummy buffer circuit 14 equal to the resistance value of the off-chip resistor 50 and to adjust the impedance of the pull-down output buffer circuit 19 to a 1/n of the resistance value of the off-chip resistor 50, on the basis of the adjustment information which has been obtained when the impedance of the first pull-down dummy buffer circuit 13 is adjusted to the resistance value of the off-chip resistor 50. Typically, the number n is an integer, for example, five. Meanwhile, the adjustment data as output from the pull-down counter 16 is represented by a set of bit signals indicative of the numerical value corresponding to the impedance of the first pull-down dummy buffer circuit 13 as adjusted. Each of the bit signals is used to take control of a corresponding one of the plurality of the transistors constituting the second pull-down dummy buffer circuit 14 and a corresponding one of the plurality of the transistors of the pull-down output buffer circuit 19. As a result, the adjustment information is used to indicate the total channel width, i.e., effective channel width of the transistors constituting the pull-down output buffer circuit 18.

Also, the electric current passing through the series circuit of the pull-up dummy buffer circuit 15 and the second pull-down dummy buffer circuit 14 becomes equal to the electric current passing through the off-chip resistor 50. The pull-up counter 17 is therefore used to change the channel width of the pull-up dummy buffer circuit 15 in order to adjust the potential level of the connection point between the pull-up dummy buffer circuit 15 and the second pull-down dummy buffer circuit 14 to VDDQ/2 and therefore to the impedance of the pull-up dummy buffer circuit 15 to the impedance of the second pull-down dummy buffer circuit 14. The impedance of the pull-up output buffer circuit 18 is then adjusted to a 1/n of the resistance value of the off-chip resistor 50. By this configuration, the impedance of the pull-up output buffer circuit 18 and the impedance of the pull-down output buffer circuit 19 are adjusted to the constant value of the 1/n of the resistance value of the off-chip resistor 50.

Meanwhile, the adjustment data as output from the pull-up counter 17 is represented by a set of bit signals indicative of the numerical value corresponding to the impedance of the pull-up dummy buffer circuit as adjusted. Each of the bit signals is used to take control of a corresponding one of the plurality of the transistors constituting the pull-up dummy buffer circuit and a corresponding one of the plurality of the transistors of the pull-up output buffer circuit 18. The adjustment information is therefore used to indicate the ratio of the effective channel width of the pull-up dummy buffer circuit to the effective channel width of the pull-down dummy buffer circuit and indicate the total channel width, i.e., effective channel width of the transistors constituting the pull-down output buffer circuit 18 as required to adjust the output impedance.

In accordance with this embodiment of the present invention, the impedance of the pull-up output buffer circuit 18 and the impedance of the pull-down output buffer circuit 19 can be maintained to the constant value by adjusting the impedance of the output buffer circuits 18 and 19 to the 1/n of the resistance value of the off-chip resistor 50 even if there is a change in the environment of the semiconductor integrated circuit provided with the programmable impedance output buffer driver, for example, the power voltage, the temperature and so forth.

In this embodiment, the power voltage of the circuit as illustrated in FIG. 4 is assumed to be 2.5V while the output voltage VDDQ is assumed to be 1.5V. The total voltage as applied across between the source and the drain terminals of both the MOS transistors connected in serial constituting the current mirror circuit 12 becomes (2.5−1.5/2)V=1.75V, when the adjustment operation of the impedance values has been completed. This total voltage as applied is substantially higher than the voltage between the source and the drain terminals in the case of the pull-up dummy buffer circuit 3 of the exemplary prior art technique as illustrated in FIG. 1.

Accordingly, even in the future when the voltage VDDQ of semiconductor integrated circuits is further decreased, a sufficient marginal area of the pentode region can be secured so that the mirror ratio of the current mirror circuit 12 can be fixed to about 1. The impedance of the pull-up output buffer circuit 18 can be adjusted to the 1/n of the resistance value of the off-chip resistor 50 with high accuracy in the same manner as well as the impedance of the pull-down output buffer circuit 19. It is therefore possible to enable the high speed operation of the semiconductor integrated circuit even with a lower power voltage.

Figure 6:
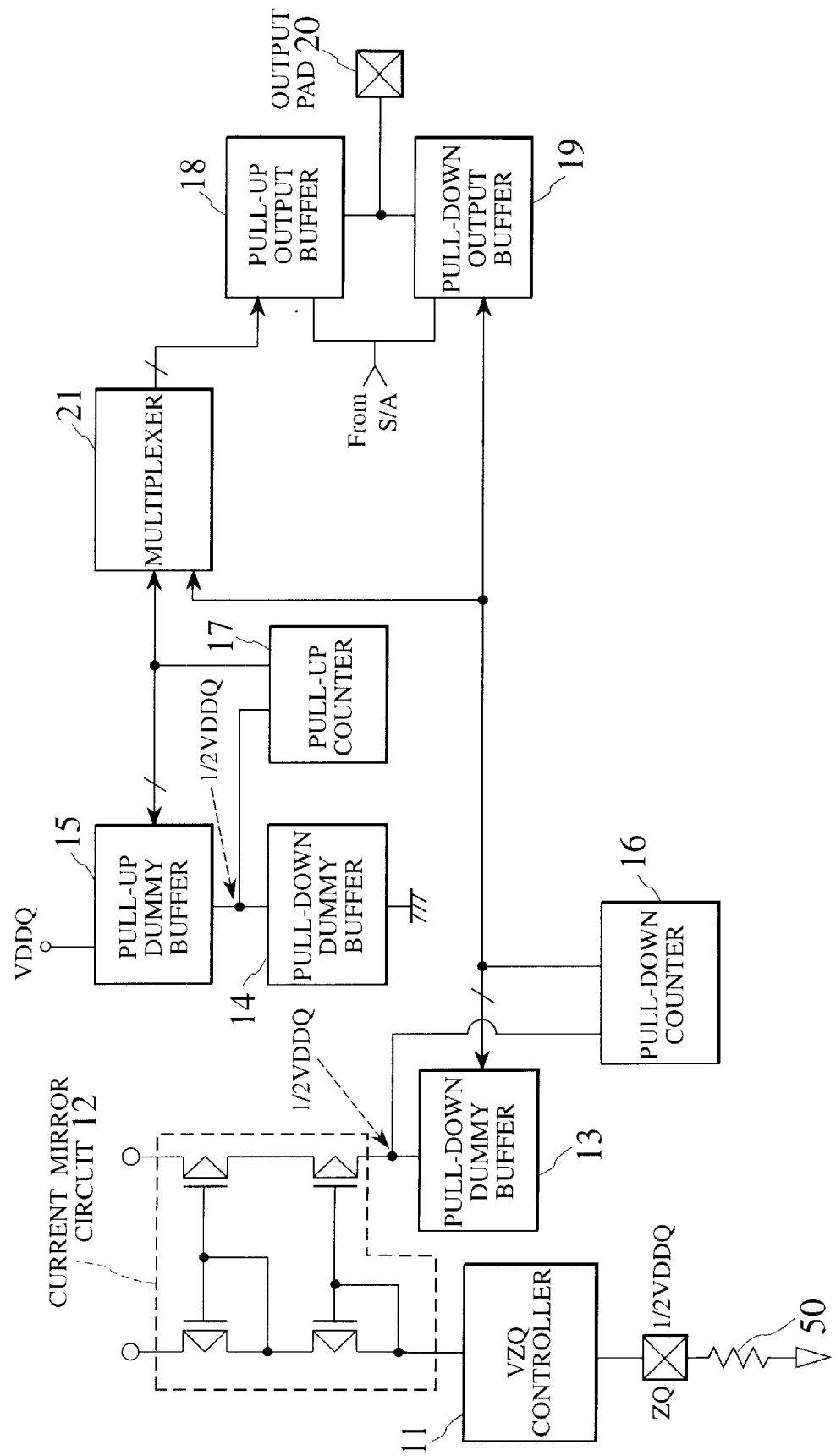
FIG. 6 is a block diagram showing a programmable impedance output buffer driver in accordance with a second embodiment of the present invention.

FIG. 6 is a block diagram showing a programmable impedance output buffer driver in accordance with a second embodiment of the present invention. In the drawing, like reference numbers indicate identical or functionally similar elements as the programmable impedance output buffer driver as illustrated in FIG. 4 and therefore redundant explanation is not repeated. In this embodiment of the present invention, there are the following differences as compared to the programmable impedance output buffer driver in accordance with the first embodiment of the present invention as illustrated in FIG. 4. Namely, the impedance of the second pull-down dummy buffer circuit 14 is fixed. And, the impedance of the pull-up output buffer circuit 18 is adjusted to the resistance value of the off-chip resistor 50 by the use of the product of the numerical value of the adjustment information of the pull-up counter 17 and the numerical value of the adjustment information the pull-down counter 16 obtained by means of a multiplexer 21. Meanwhile, the adjustment data as output from the pull-up counter 17 is a set of bit signals indicative of the numerical value corresponding to the impedance of the pull-up dummy buffer circuit 15 as adjusted. Each of the bit signals is used to take control of a corresponding one of the plurality of the transistors constituting the pull-up output buffer circuit 18. On the other hand, the multiplexer 21 serves to perform an appropriate multiplication operation of the channel width of the first pull-down dummy buffer circuit 13 and the ratio of the channel width of the second pull-down dummy buffer circuit 14 to the channel width of the pull-up dummy buffer circuit 15 to generate the adjustment information of the pull-up output buffer circuit 18.

Next, the operation of this embodiment of the present invention will be explained. The impedance of the first pull-down dummy buffer circuit 13 is adjusted to the resistance value of the off-chip resistor 50 connected to the pad ZQ in accordance with the adjustment information of the pull-down counter 16. The adjustment information is used to adjust the impedance of the pull-down output buffer circuit 19 equal to the resistance value of the off-chip resistor 50 and transferred to the multiplexer 21.

On the other hand, the pull-up counter 17 is used to adjust the impedance of the pull-up dummy buffer circuit 15 equal to the fixed impedance of the second pull-down dummy buffer circuit 14 in order that the potential level of the connection point between the pull-up dummy buffer circuit 15 and the second pull-down dummy buffer circuit 14 becomes VDDQ/2.

For example, it is assumed that, when the impedance of the pull-up dummy buffer circuit 15 has been adjusted to the impedance of the second pull-down dummy buffer circuit 14 by means of the adjustment operation of the pull-up counter 17, the fixed channel width of the second pull-down dummy buffer circuit 14 as adjusted and the effective channel width of the pull-up dummy buffer circuit 15 are W and α W respectively. In this case, the ratio α is transferred to the multiplexer 21 from the pull-up counter 17 since the ratio α is the value required to make equal the impedance of the pull-up dummy buffer circuit 15 and the impedance of the second pull-down dummy buffer circuit 14.

Also, it is assumed that, when the impedance of the first pull-down dummy buffer circuit 13 is in agreement with the resistance value of the off-chip resistor 50, the channel width of the first pull-down dummy buffer circuit 13 is controlled to be Wo by the pull-down counter 16. Then, the adjustment information corresponding to the channel width of Wo is transferred to the multiplexer 21 from the pull-down counter 16.

The ratio α and the channel width of Wo are multiplied by the multiplexer 21. The result of the multiplication α Wo is then transferred to the pull-up output buffer circuit 18, as appropriate adjustment information. Then, the channel width of the pull-up output buffer circuit 18 is set to α Wo. The impedance of the pull-up output buffer circuit 18 is then controlled to be equal to the resistance value of the off-chip resistor 50.

In the case of this embodiment of the present invention as explained above, it is assumed that the sets of the transistors constituting the pull-down dummy buffer circuits 13 and 14, the set of the transistors constituting the pull-up dummy buffer circuit 15, the set of the transistors constituting the pull-up output buffer circuit 18 and the set of the transistors constituting the pull-down output buffer circuit 19 have the same configuration with respect to the channel widths. However, generally speaking, the impedances of the pull-down dummy buffer circuits 13 and 14 and the pull-up dummy buffer circuit 15 are larger than the impedances of the pull-up output buffer circuit 18 and the pull-down output buffer circuit 19. For example, the electric current passing through the former is ⅕ of the latter. In this case, the channel widths of the transistors constituting the pull-up output buffer circuit 18 and the pull-down output buffer circuit 19 are designed as larger than those of the pull-down dummy buffer circuits 13 and 14 and the pull-up dummy buffer circuit 15 by a factor of an integer n, for example, five so that the impedances of the pull-up output buffer circuit 18 and the pull-down output buffer circuit 19 can be adjusted to the 1/n, for example, ⅕ of the resistance value of the off-chip resistor 50 in the same manner.

Also in accordance with this embodiment of the present invention, it is possible to secure a sufficient marginal area of the pentode region and maintain the mirror ratio of about 1 so that the impedances of the output buffer circuits 18 and 19 can be adjusted to the 1/n of the resistance value of the off-chip resistor 50 with high accuracy, in the same manner as the first embodiment of the present invention.

Furthermore, in this embodiment of the present invention, since the impedance of the pull-up dummy buffer circuit 15 is adjusted to the fixed impedance of the second pull-down dummy buffer circuit 14, it is possible to stabilize the adjustment operation of the impedance of the pull-up output buffer circuit 18 and to adjust the impedance of the pull-up output buffer circuit 18 to the 1/n of the resistance value of the off-chip resistor 50 with high accuracy and high reliability.

Figure 7:
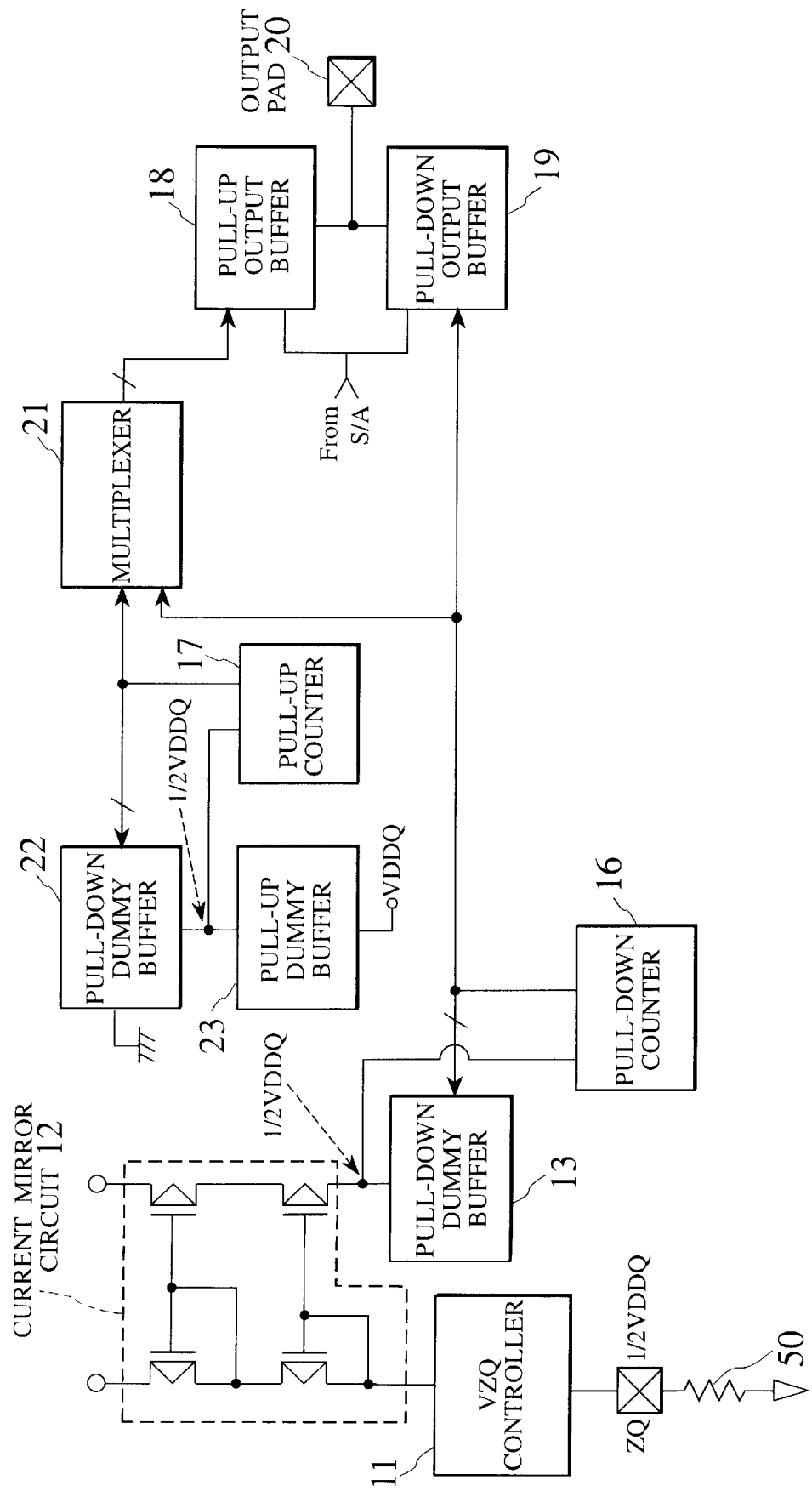
FIG. 7 is a block diagram showing a programmable impedance output buffer driver in accordance with a third embodiment of the present invention.

FIG. 7 is a block diagram showing a programmable impedance output buffer driver in accordance with a third embodiment of the present invention. Also in the drawing, like reference numbers indicate identical or functionally similar elements as the programmable impedance output buffer driver as illustrated in FIG. 6 and therefore redundant explanation is not repeated. In this embodiment of the present invention, while the impedance of the pull-up dummy buffer circuit 23 is fixed, the pull-up counter 17 is used to adjust the impedance of the pull-down dummy buffer circuit 22 to the fixed impedance of the pull-up dummy buffer circuit 23.

For example, it is assumed that, when the impedance of the pull-down dummy buffer circuit 22 is adjusted to the fixed impedance W of the pull-up dummy buffer circuit 23, the channel width of the pull-down dummy buffer circuit 22 is adjusted to βW by means of the adjustment operation of the pull-up counter 17. In this case, the ratio 1/β is transferred to the multiplexer 21 from the pull-up counter 17 since the ratio 1/β is the value required to make equal the impedance of the pull-up dummy buffer circuit 23 and the impedance of the pull-down dummy buffer circuit 22.

Also, it is assumed that, when the impedance of the pull-down dummy buffer circuit 22 is in agreement with the resistance value of the off-chip resistor 50, the channel width of the pull-down dummy buffer circuit 22 is controlled to be Wo by the pull-down counter 16. Then, the adjustment information corresponding to the channel width of Wo is transferred to the multiplexer 21 from the pull-down counter 16.

The ratio 1/β and the channel width of Wo are multiplied by the multiplexer 21. The result of the multiplication Wo/β is then transferred to the pull-up output buffer circuit 18, as appropriate adjustment information. Then, the channel width of the pull-up output buffer circuit 18 is set to Wo/β.

The impedance of the pull-up output buffer circuit 18 is then controlled to be equal to the resistance value of the off-chip resistor 50 in the same manner as the second embodiment of the present invention as illustrated in FIG. 6.

The programmable impedance output buffer driver in accordance with the present invention is possibly effective, when used in point-to-point connection, in order to further increase the operation speed.

Figure 8:
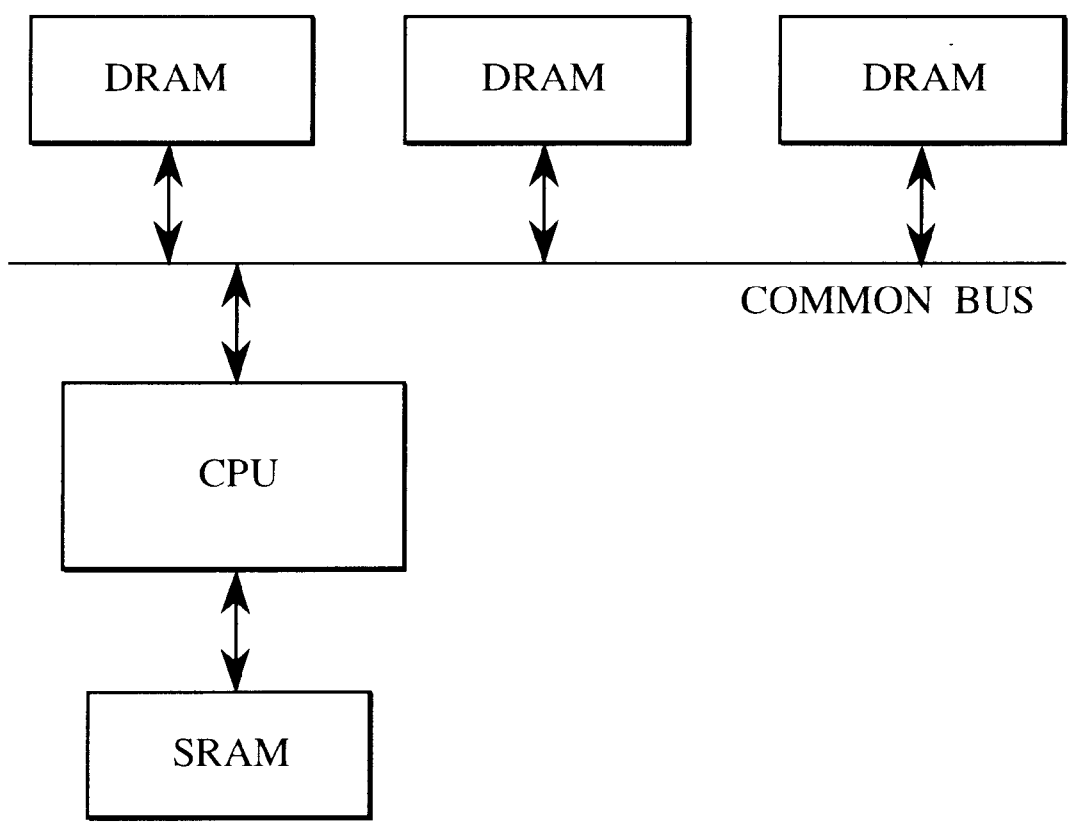
FIG. 8 is a circuit diagram showing an SRAM in the form of a semiconductor large-scale integrated circuit chip as connected to one of two data ports of a processor.

FIG. 8 is a circuit diagram showing a static random access memory in the form of a semiconductor large-scale integrated circuit chip as connected to one of two data ports of a processor as an example of a point-to-point connection. In this case, the programmable impedance output buffer driver in accordance with the present invention is formed also in said one of two data ports of the processor as well as in the output signal of the static random access memory. The other of the two data ports of the processor is connected to a common bus on which a plurality of DRAMs are connected In parallel. In this case, while the connection between DRAMs and the processor are connected through a common bus, the operation speed of DRAMs is not so high as compared with the operation speed of the static random access memory so that there is little possibility of causing an impedance matching problem.

Figure 9:
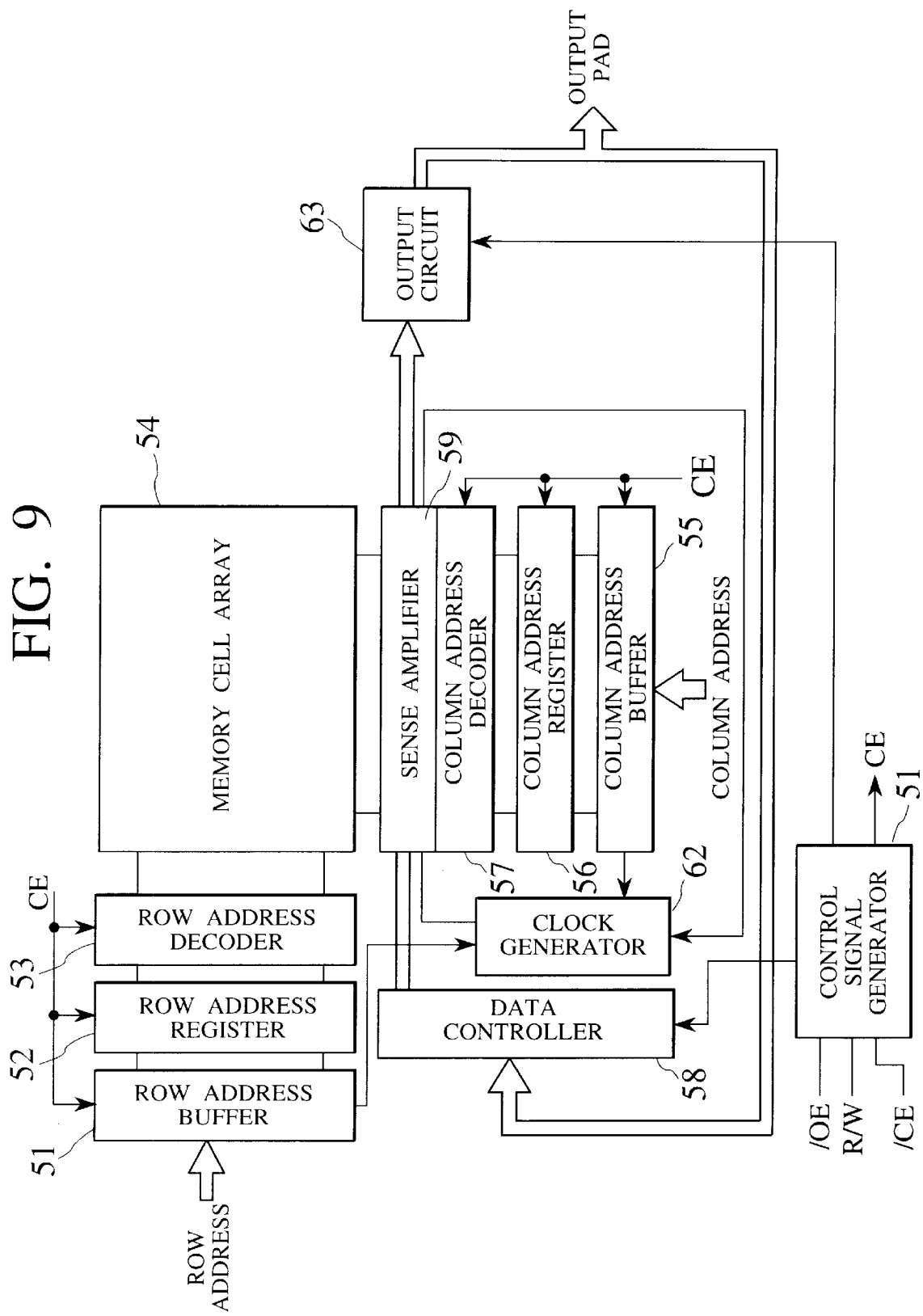
FIG. 9 is a block diagram showing an SRAM in the form of a semiconductor large-scale integrated circuit chip in accordance with the embodiment of the present invention.

FIG. 9 is a block diagram showing the static random access memory in the form of the semiconductor large-scale integrated circuit chip in accordance with the embodiment of the present invention.

The semiconductor large-scale integrated circuit chip has a row address buffer circuit 51 for receiving a row address, a row address register 52, and a row address decoder 53 for decoding the row address. These elements 51 to 53 are cascaded and connected to the rows of a memory cell array 54 for storing data. The semiconductor large-scale integrated circuit chip further has a column address buffer circuit 55 for receiving a column address, a column address register 56, and a column address decoder 57. These elements 55 to 57 are cascaded and connected to the columns of the memory cell array 54.

To write data into the memory cell array 54, a row address and column address are provided to specify a memory cell in the array 54, and data as input from output pads functioning also as input pads is written into the specified cell through a data controller 58, and a sense amplifier 59. To read data out of the memory cell array 54, a row address and a column address are provided to specify a memory cell in the array 54, and data in the specified cell is transferred to the output pad through the sense amplifier 59 and a programmable impedance output buffer driver 63 in accordance with the present invention.

A signal generator 61 generates a control signal for controlling the data controller 58 and a chip enable signal CE used to specify an address. A clock generator 62 generates a clock signal.

As described above in details, in accordance with the present invention, since a sufficient marginal area of the pentode region can be secured even with a lower power voltage, the impedance of the output buffer circuits can be adjusted to the resistance value of the off-chip resistor with high accuracy so that it is possible to enable the high speed operation of the semiconductor integrated circuit irrespective of change in the environment.

The foregoing description of preferred embodiments has been presented for purposes of illustration and description. It is not intended to be exhaustive or to limit the invention to the precise form described, and obviously many modifications and variations are possible light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A semiconductor device having a programmable impedance output port comprising:

a pad to which an external resistor is to be connected;

a voltage controlling circuit for controlling the potential level of said pad;

a current mirror circuit connected in series with said pad and said voltage controlling circuit in order to generate a mirror current of the electric current applied to said pad;

a first pull-down dummy buffer circuit having a variable impedance and connected to said current mirror circuit in series in order that said mirror current flows said first pull-down dummy buffer circuit;

a second pull-down dummy buffer circuit having a variable impedance;

a pull-up dummy buffer circuit having a variable impedance and connected to said second pull-down dummy buffer circuit in series;

a pull-down output buffer circuit having a variable impedance connected to said programmable impedance output port;

a pull-up output buffer circuit having a variable impedance connected to said programmable impedance output port;

a first control circuit for controlling the impedance of said first pull-down dummy buffer circuit in agreement with the resistance value of said external resistor in order to generate first adjustment information, for controlling the impedance of said second pull-down dummy buffer circuit in agreement with the resistance value of said external resistor with reference to said first adjustment information, and for controlling the impedance of said pull-down output buffer circuit to an appropriate value which is proportional to the resistance value of said external resistor with reference to said first adjustment information; and a second control circuit for controlling the impedance of said pull-up dummy buffer circuit in agreement with the impedance of said second pull-down dummy buffer circuit in order to generate second adjustment information, and for controlling the impedance of said pull-up output buffer circuit to an appropriate value which is proportional to the resistance value of said external resistor with reference to said second adjustment information.

2. The semiconductor device having a programmable impedance output port as claimed in claim 1 wherein the impedance of said pull-down output buffer circuit is adjusted to 1/n of the resistance value of said external resistor with reference to said first adjustment information, where n is no smaller than 1.

3. The semiconductor device having a programmable impedance output port as claimed in claim 2 wherein the number n is an integer.

4. The semiconductor device having a programmable impedance output port as claimed in claim 1 wherein said first pull-down dummy buffer circuit, said second pull-down dummy buffer circuit, said pull-up dummy buffer circuit, said pull-down output buffer circuit and said pull-up output buffer circuit are composed of the same number of the transistors as connected in parallel.

5. The semiconductor device having a programmable impedance output port as claimed in claim 1 wherein said first pull-down dummy buffer circuit, said second pull-down dummy buffer circuit, said pull-up dummy buffer circuit, said pull-down output buffer circuit and said pull-up output buffer circuit are composed respectively of a plurality of transistors connected in parallel, and wherein the adjustment information of said first control circuit is indicative of the channel width of said first pull-down dummy buffer circuit while the adjustment information of said second control circuit is indicative of the ratio of the effective channel width of said pull-up dummy buffer circuit to the effective channel width of said second pull-down dummy buffer circuit.

6. The semiconductor device having a programmable impedance output port as claimed in claim 1 wherein said first pull-down dummy buffer circuit and said second pull-down dummy buffer circuit are designed in the same configuration in terms of the channel length and the channel width of the transistors thereof.

7. The semiconductor device having a programmable impedance output port as claimed in claim 6 wherein said second control circuit serves to perform an appropriate operation of the channel width of said first pull-down dummy buffer circuit and the ratio of the channel width of said second pull-down dummy buffer circuit to the channel width of said pull-up dummy buffer circuit to generate the adjustment information of the pull-up output buffer circuit.

8. The semiconductor device having a programmable impedance output port as claimed in claim 1 wherein said first control circuit serves to adjust the potential at the connection point between said current mirror circuit and said first pull-down dummy buffer circuit to a constant potential corresponding to a half of the output voltage of the programmable impedance output port, and wherein said second control circuit serves to adjust the potential at the connection point between said second pull-down dummy buffer circuit and said pull-up dummy buffer circuit to a constant potential corresponding to a half of the output voltage of the programmable impedance output port.

9. A semiconductor device having a programmable impedance output port comprising:

a pad to which an external resistor is to be connected;

a voltage controlling circuit for controlling the potential level of said pad;

a current mirror circuit connected in series with said pad and said voltage controlling circuit in order to generate a mirror current of the electric current passing through said external resistor from said pad;

a first pull-down dummy buffer circuit having a variable impedance and connected to said current mirror circuit in series in order that said mirror current flows said first pull-down dummy buffer circuit;

a second pull-down dummy buffer circuit having a fixed impedance;

a pull-up dummy buffer circuit having a variable impedance and connected to said second pull-down dummy buffer circuit in series;

a pull-down output buffer circuit having a variable impedance connected to said programmable impedance output port;

a pull-up output buffer circuit having a variable impedance connected to said programmable impedance output port;

a first control circuit for controlling the impedance of said first pull-down dummy buffer circuit in agreement with the resistance value of said external resistor in order to generate first adjustment information, and for controlling the impedance of said pull-down output buffer circuit to an appropriate value which is proportional to the resistance value of said external resistor with reference to said first adjustment information;

a second control circuit for controlling the impedance of said pull-up dummy buffer circuit in agreement with the impedance of said second pull-down dummy buffer circuit in order to generate second adjustment information; and a calculation circuit for performing an appropriate operation using the first adjustment information obtained from the first control circuit and the second adjustment information obtained from the second control circuit, wherein the impedance of said pull-up output buffer circuit is adjusted to an appropriate value which is proportional to the resistance value of said external resistor with reference to the result of said appropriate operation.

10. The semiconductor device having a programmable impedance output port as claimed in claim 9 wherein the impedance of said pull-down output buffer circuit is adjusted to 1/n of the resistance value of said external resistor with reference to said first adjustment information, where n is no smaller than 1.

11. The semiconductor device having a programmable impedance output port as claimed in claim 10 wherein the number n is an integer.

12. The semiconductor device having a programmable impedance output port as claimed in claim 9 wherein said first pull-down dummy buffer circuit, said second pull-down dummy buffer circuit, said pull-up dummy buffer circuit, said pull-down output buffer circuit and said pull-up output buffer circuit are composed of the same number of the transistors as connected in parallel.

13. The semiconductor device having a programmable impedance output port as claimed in claim 9 wherein said first pull-down dummy buffer circuit, said second pull-down dummy buffer circuit, said pull-up dummy buffer circuit, said pull-down output buffer circuit and said pull-up output buffer circuit are composed respectively of a plurality of transistors connected in parallel, and wherein the adjustment information of said first control circuit is indicative of the channel width of said first pull-down dummy buffer circuit while the adjustment information of said second control circuit is indicative of the ratio of the effective channel width of said pull-up dummy buffer circuit to the effective channel width of said second pull-down dummy buffer circuit.

14. The semiconductor device having a programmable impedance output port as claimed in claim 9 wherein said first pull-down dummy buffer circuit and said second pull-down dummy buffer circuit are designed in the same configuration in terms of the channel length and the channel width of the transistors thereof.

15. The semiconductor device having a programmable impedance output port as claimed in claim 14 wherein said second control circuit serves to perform an appropriate operation of the channel width of said first pull-down dummy buffer circuit and the ratio of the channel width of said second pull-down dummy buffer circuit to the channel width of said pull-up dummy buffer circuit to generate the adjustment information of the pull-up output buffer circuit.

16. The semiconductor device having a programmable impedance output port as claimed in claim 9 wherein said first control circuit serves to adjust the potential at the connection point between said current mirror circuit and said first pull-down dummy buffer circuit to a constant potential corresponding to a half of the output voltage of the programmable impedance output port, and wherein said second control circuit serves to adjust the potential at the connection point between said second pull-down dummy buffer circuit and said pull-up dummy buffer circuit to a constant potential corresponding to a half of the output voltage of the programmable impedance output port.

17. A semiconductor device having a programmable impedance output port comprising:

a pad to which an external resistor is to be connected;

a voltage controlling circuit for controlling the potential level of said pad;

a current mirror circuit connected in series with said pad and said voltage controlling circuit in order to generate a mirror current of the electric current passing through said external resistor from said pad;

a first pull-down dummy buffer circuit having a variable impedance and connected to said current mirror circuit in series in order that said mirror current flows said first pull-down dummy buffer circuit;

a second pull-down dummy buffer circuit having a variable impedance;

a pull-up dummy buffer circuit having a fixed impedance and connected to said second pull-down dummy buffer circuit in series;

a pull-down output buffer circuit having a variable impedance connected to said programmable impedance output port;

a pull-up output buffer circuit having a variable impedance connected to said programmable impedance output port;

a first control circuit for controlling the impedance of said first pull-down dummy buffer circuit in agreement with the resistance value of said external resistor in order to generate first adjustment information, and for controlling the impedance of said pull-down output buffer circuit to an appropriate value which is proportional to the resistance value of said external resistor with reference to said first adjustment information;

a second control circuit for controlling the impedance of said second pull-down dummy buffer circuit in agreement with the impedance of said pull-up dummy buffer circuit in order to generate second adjustment information; and a calculation circuit for performing an appropriate operation using the first adjustment information obtained from the first control circuit and the second adjustment information obtained from the second control circuit, wherein the impedance of said pull-up output buffer circuit is adjusted to an appropriate value which is proportional to the resistance value of said external resistor with reference to the result of said appropriate operation.

18. The semiconductor device having a programmable impedance output port as claimed in claim 17 wherein the impedance of said pull-down output buffer circuit is adjusted to 1/n of the resistance value of said external resistor with reference to said first adjustment information, where n is no smaller than 1.

19. The semiconductor device having a programmable impedance output port as claimed in claim 18 wherein the number n is an integer.

20. The semiconductor device having a programmable impedance output port as claimed in claim 17 wherein said first pull-down dummy buffer circuit, said second pull-down dummy buffer circuit, said pull-up dummy buffer circuit, said pull-down output buffer circuit and said pull-up output buffer circuit are composed of the same number of the transistors as connected in parallel.

21. The semiconductor device having a programmable impedance output port as claimed in claim 17 wherein said first pull-down dummy buffer circuit, said second pull-down dummy buffer circuit, said pull-up dummy buffer circuit, said pull-down output buffer circuit and said pull-up output buffer circuit are composed respectively of a plurality of transistors connected in parallel, and wherein the adjustment information of said first control circuit is indicative of the channel width of said first pull-down dummy buffer circuit while the adjustment information of said second control circuit is indicative of the ratio of the effective channel width of said pull-up dummy buffer circuit to the effective channel width of said second pull-down dummy buffer circuit.

22. The semiconductor device having a programmable impedance output port as claimed in claim 17 wherein said first pull-down dummy buffer circuit and said second pull-down dummy buffer circuit are designed in the same configuration in terms of the channel length and the channel width of the transistors thereof.

23. The semiconductor device having a programmable impedance output port as claimed in claim 22 wherein said second control circuit serves to perform an appropriate operation of the channel width of said first pull-down dummy buffer circuit and the ratio of the channel width of said second pull-down dummy buffer circuit to the channel width of said pull-up dummy buffer circuit to generate the adjustment information of the pull-up output buffer circuit.

24. The semiconductor device having a programmable impedance output port as claimed in claim 17 wherein said first control circuit serves to adjust the potential at the connection point between said current mirror circuit and said first pull-down dummy buffer circuit to a constant potential corresponding to a half of the output voltage of the programmable impedance output port, and wherein said second control circuit serves to adjust the potential at the connection point between said second pull-down dummy buffer circuit and said pull-up dummy buffer circuit to a constant potential corresponding to a half of the output voltage of the programmable impedance output port.

25. A programmable impedance output buffer driver comprising:

a pad to which an external resistor is to be connected;

a voltage controlling circuit for controlling the potential level of said pad;

a current mirror circuit connected in series with said pad and said voltage controlling circuit in order to generate a mirror current of the electric current passing through said external resistor from said pad;

a first pull-down dummy buffer circuit having a variable impedance and connected to said current mirror circuit in series in order that said mirror current flows said first pull-down dummy buffer circuit;

a second pull-down dummy buffer circuit having a variable impedance;

a pull-up dummy buffer circuit having a variable impedance and connected to said second pull-down dummy buffer circuit in series;

a pull-down output buffer circuit having a variable impedance connected to said programmable impedance output port;

a pull-up output buffer circuit having a variable impedance connected to said programmable impedance output port;

a first control circuit for controlling the impedance of said first pull-down dummy buffer circuit in agreement with the resistance value of said external resistor in order to generate first adjustment information, for controlling the impedance of said second pull-down dummy buffer circuit in agreement with the resistance value of said external resistor with reference to said first adjustment information, and for controlling the impedance of said pull-down output buffer circuit to an appropriate value which is proportional to the resistance value of said external resistor with reference to said first adjustment information; and a second control circuit for controlling the impedance of said pull-up dummy buffer circuit in agreement with the impedance of said second pull-down dummy buffer circuit in order to generate second adjustment information, and for controlling the impedance of said pull-up output buffer circuit to an appropriate value which is proportional to the resistance value of said external resistor with reference to said second adjustment information.

26. A programmable impedance output buffer driver comprising:

a pad to which an external resistor is to be connected;

a voltage controlling circuit for controlling the potential level of said pad;

a current mirror circuit connected in series with said pad and said voltage controlling circuit in order to generate a mirror current of the electric current passing through said external resistor from said pad;

a first pull-down dummy buffer circuit having a variable impedance and connected to said current mirror circuit in series in order that said mirror current flows said first pull-down dummy buffer circuit;

a second pull-down dummy buffer circuit having a fixed impedance;

a pull-up dummy buffer circuit having a variable impedance and connected to said second pull-down dummy buffer circuit in series;

a pull-down output buffer circuit having a variable impedance connected to said programmable impedance output port;

a pull-up output buffer circuit having a variable impedance connected to said programmable impedance output port;

a first control circuit for controlling the impedance of said first pull-down dummy buffer circuit in agreement with the resistance value of said external resistor in order to generate first adjustment information, and for controlling the impedance of said pull-down output buffer circuit to an appropriate value which is proportional to the resistance value of said external resistor with reference to said first adjustment information;

a second control circuit for controlling the impedance of said pull-up dummy buffer circuit in agreement with the impedance of said second pull-down dummy buffer circuit in order to generate second adjustment information; and a calculation circuit for performing an appropriate operation using the first adjustment information obtained from the first control circuit and the second adjustment information obtained from the second control circuit, wherein the impedance of said pull-up output buffer circuit is adjusted to an appropriate value which is proportional to the resistance value of said external resistor with reference to the result of said appropriate operation.

27. A programmable impedance output buffer driver comprising:

a pad to which an external resistor is to be connected;

a voltage controlling circuit for controlling the potential level of said pad;

a current mirror circuit connected in series with said pad and said voltage controlling circuit in order to generate a mirror current of the electric current passing through said external resistor from said pad;

a first pull-down dummy buffer circuit having a variable impedance and connected to said current mirror circuit in series in order that said mirror current flows said first pull-down dummy buffer circuit;

a second pull-down dummy buffer circuit having a variable impedance;

a pull-up dummy buffer circuit having a fixed impedance and connected to said second pull-down dummy buffer circuit in series;

a pull-down output buffer circuit having a variable impedance connected to said programmable impedance output port;

a pull-up output buffer circuit having a variable impedance connected to said programmable impedance output port;

a first control circuit for controlling the impedance of said first pull-down dummy buffer circuit in agreement with the resistance value of said external resistor in order to generate first adjustment information, and for controlling the impedance of said pull-down output buffer circuit to an appropriate value which is proportional to the resistance value of said external resistor with reference to said first adjustment information;

a second control circuit for controlling the impedance of said second pull-down dummy buffer circuit in agreement with the impedance of said pull-up dummy buffer circuit in order to generate second adjustment information; and a calculation circuit for performing an appropriate operation using the first adjustment information obtained from the first control circuit and the second adjustment information obtained from the second control circuit, wherein the impedance of said pull-up output buffer circuit is adjusted to an appropriate value which is proportional to the resistance value of said external resistor with reference to the result of said appropriate operation.

* * * * *